United States Patent [19]
Kiyama et al.

[11] Patent Number: 5,053,245
[45] Date of Patent: Oct. 1, 1991

[54] METHOD OF IMPROVING THE QUALITY OF AN EDGE SURFACE OF A CUTTING DEVICE

[75] Inventors: Seiichi Kiyama, Takatsuki; Hitoshi Hirano, Nishinomiya; Masao Onji, Shijonawate, all of Japan

[73] Assignee: Sanyo Electric Co., Ltd., Osaka, Japan

[21] Appl. No.: 603,114

[22] Filed: Oct. 25, 1990

[30] Foreign Application Priority Data

Oct. 26, 1989 [JP] Japan .................................. 1-280251
Mar. 22, 1990 [JP] Japan .................................. 2-72513
Mar. 26, 1990 [JP] Japan .................................. 2-76118

[51] Int. Cl.$^5$ .............................................. B05D 3/06
[52] U.S. Cl. .................................. 427/38; 427/249; 427/250; 427/251; 427/255.2; 427/255.3; 427/255.7; 427/405; 427/419.1; 427/419.2; 427/419.7

[58] Field of Search ................. 427/38, 249, 250, 251, 427/255.2, 255.3, 255.7, 405, 419.1, 419.2, 419.7

[56] References Cited

FOREIGN PATENT DOCUMENTS 62-382   1/1987   Japan .
61-106767 5/1990  Japan .

Primary Examiner—Bernard Pianalto
Attorney, Agent, or Firm—Armstrong, Nikaido, Marmelstein, Kubovcik & Murray

[57] ABSTRACT

A method of improving the quality of an edge surface of a cutting device, the method comprising a first step of irradiating assisting ions obtained from a first substance, which is in the state of gas in the room temperature, and a second substance, which is vapor-deposited from a hard material, onto a surface of a base body to form a first layer comprising of the hard material influenced by the assisting ions; and a second step of irradiating the second substance onto the first layer in an atmosphere of the first substance to form a second layer.

10 Claims, 9 Drawing Sheets

METHOD OF IMPROVING THE QUALITY OF AN EDGE SURFACE OF A CUTTING DEVICE

BACKGROUND OF THE INVENTION (1) Field of the Invention

This invention relates to a method of improving the quality of edge surfaces of cutting devices such as razors, kitchen, surgical and other knives, scissors, and mechanical cutting tools.

(2) Description of the Prior Art

Edge surfaces of cutting tools are required to have a high hardness.

Japanese Patent Publication Laid-Open Nos. 61-106767 and 62-382 have disclosed methods of improving the quality of edge surfaces, especially in terms of hardness. These methods are characterized in that vacuum deposition and ion irradiation are carried out simultaneously to the edge, thereby to form a mixture layer of the vacuum-deposited atoms and the irradiated ions.

However, these methods have the following problems.

1) The vacuum-deposited metal atoms are sputtered reversely by the irradiated ions, so as to lower the film forming speed.
2) Since the ions bump into the edge (will be referred to as the base body, hereinafter) by a large acceleration voltage, the surface temperature of the base body is increased, which restricts the range of materials which can be used for the base body.

The material of the base body determines the characteristics of the film such as the crystallinity and the orientation, which can only be controlled in such a complicated and difficult way as changing the angle or the acceleration voltage for irradiating the ions.

With only keeping the temperature of the base body low being taken into consideration, a film of a highly hard material could be formed by vapor-depositing metal atoms which are in the state of gas in the room temperature or sputtering ions onto the base body. However, the film formed by such methods is adhered on the base body weakly enough to be peeled off or cracked easily.

SUMMARY OF THE INVENTION

Accordingly, this invention has an object of offering a method of improving the quality of an edge surface of a cutting device by forming a thin film excellent in hardness, crystallinity and adhering strength on a base body at a high speed while restricting the rise in the surface temperature of the base body.

This invention has another object of offering a method of improving the quality of an edge surface of a cutting device by controlling the quality of a layer between a base body and a main part of a film formed on the base body.

This invention has still another object of offering a method of improving the quality of an edge surface to make the surface suitable for a cutting device such as an electric razor.

The above objects are fulfilled by a method of improving the quality of an edge surface of a cutting device, the method comprising a first step of irradiating assisting ions obtained from a first substance, which is in the state of gas in the room temperature, and a second substance, which is vapor-deposited from a hard material, onto a surface of a base body to form a first layer comprising of the hard material influenced by the assisting ions; and a second step of irradiating the second substance onto the first layer in an atmosphere of the first substance to form a second layer.

The first substance may be selected from a group consisting of $H_2$, $O_2$, $N_2$, CO, $CH_4$, $CO_2$, $C_2H_2$ and $NH_3$.

The hard material may be selected from a group consisting of La, Ti, Zr, Nb, Ta, Mo, W, Co, Fe, Ni, Cr, Hf, V, Al, Mn, Re, Os, Cd, Au, Pt, Si, $Al_2O_3$, $TiO_2$, $TA_2O_3$, $SiO_2$, $ZrO_2$, $HfO_2$, AlN, BN, TiN, ZrN, HfN, CrN, CoN, WN, LaN, NbN, TaN, MoN, TiC, SiC, WC, ZrC, BC, MoC, HfC, TiB, WB, B and C.

The first layer may be formed with a ratio of the assisting ions of the first substance against the second substance being 0.2 at the lowest, the ratio being measured on the base body.

The above ratio may be adjusted to control the orientation and the crystallinity of the second layer.

An acceleration voltage for the assisting ions may be reduced in the passage of time hyperbolically.

The cutting device may be an electric razor blade.

The first step may be finished before a temperature of the base body gets high enough to damage flexibility of the base body, and the second step is continued until the first and the second layers get a desirable total thickness.

The first and the second steps may be repeated in the above order.

The above method may further comprise a step of irradiating carbon atoms and hydrogen ions simultaneously to form a pseudo-diamond film on a surface of the second layer.

According to the above method, the first and the second layers are both formed by using a first substance, which is in the state of gas at the room temperature, and a second substance, which is vapor-deposited from a hard material. Therefore, a film comprising the first and the second layers is adhered on the base body strongly with no worry of peeling off.

If the first step is continued for a long time, the second substance is sputtered reversely by the irradiated assisting ions, thereby slowing the layer forming and thus increasing the temperature of the base body. According to the present invention, however, the first step is finished within a short period of time, whereby to prevent this problem. In the second step, the second layer is added on the first layer using the second substance in an atmosphere of the first layer at a high speed in a low temperature. In consequence, the second layer is adhered on the base body strongly with the first layer therebetween.

According to this invention, as mentioned above, the use of assisting ions for adhering the film and the base body strongly and the use of gas for enhancing the crystallinity and the forming speed of the film are combined. As a result, a film excellent in hardness, crystallinity and adhering strength on the base body is formed at a high speed and in a low temperature.

Furthermore, the quality of an edge surface is improved by adjusting the quality of the first layer.

If the acceleration voltage is slowly reduced so that the surface temperature of the base body may be kept low enough to maintain the flexibility thereof and if the ratio of the assisting ions of the first substance against the second substance is set 0.2 at the lowest, a hard, flexible and highly abrasion-resistant edge suitable for an electric razor can be formed. Also concerning the edges other than the one for the electric razor, the low film forming temperature has less affect on the base body. Therefore, the life of the base body is extended and cracks are prevented.

If a pseudo-diamond film is formed on the second layer, higher hardness is obtained.

Since the pseudo-diamond film is formed on the base body with the first and the second layers therebetween, the pseudo-diamond film is harder to peel off than a pseudo-diamond film directly adhered on base body, and the range of materials usable for the base body is expanded.

BRIEF DESCRIPTION OF THE DRAWINGS

These and other objects, advantages and features of the invention will become apparent form the following description thereof taken in conjunction with the accompanying drawings which illustrate specific embodiments of the invention. In the drawings.

DESCRIPTION OF THE PREFERRED EMBODIMENTS

Embodiment I

As a first embodiment of this invention, a method of forming a zirconium nitride (ZrN) film on an edge of an electric razor will be described.

Figure 1:
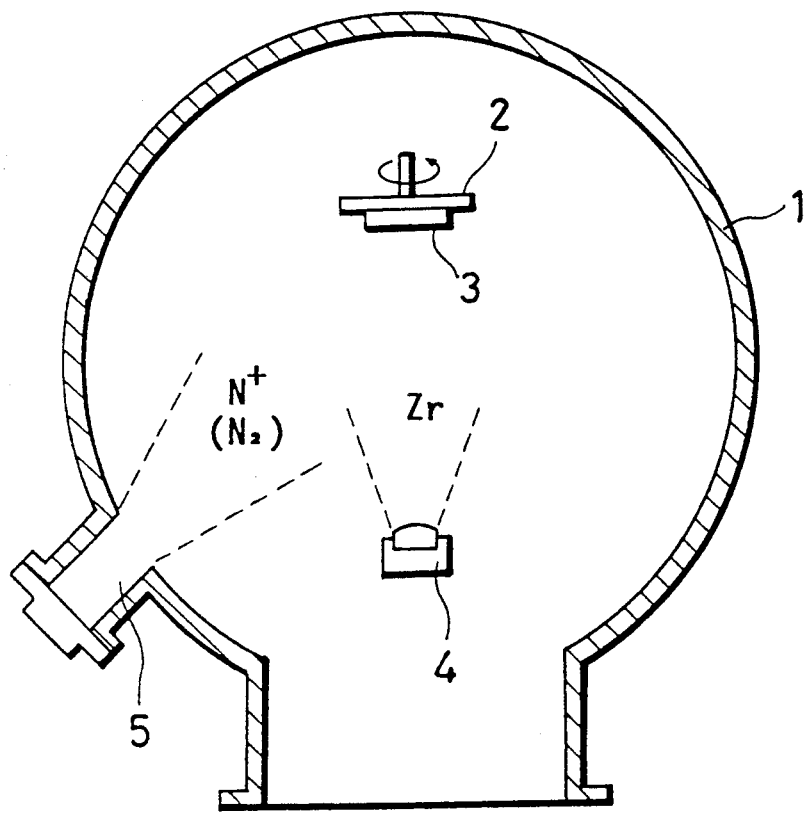
FIG. 1 is a schematic view of an apparatus for forming a thin film by a first embodiment according to this invention.

FIG. 1 shows a vacuum deposition and ion irradiation apparatus for forming a ZrN film by the embodiment. 1 refers to a chamber whose air pressure is to be reduced to $10^{-5}$ to $10^{-7}$ torr, 2 to an edge base holder provided inside the chamber 1 and rotatable in a direction of the arrow at a speed of 10 to 20 rpm, and 3 to a nickel (Ni) edge base as a base body attached on the edge base holder 2. 4 is a vapor deposition source for vapor-depositing Zr atoms toward the Ni edge base 3 by an electron beam, and 5 is an assisting ion gun for irradiating nitrogen ions (N+) or supplying nitrogen gas ($N_2$) to the Ni edge base 3.

Figure 2:
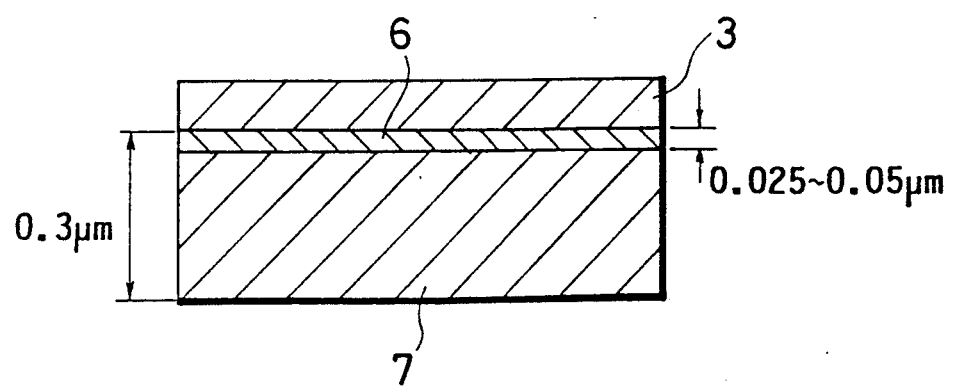
FIG. 2 is a cross sectional view of a ZrN film formed by the above embodiment.

As shown in FIG. 2, the ZrN film formed on the Ni edge base 3 comprises a first layer 6 and a second layer 7. How to form such ZrN film will be described hereinafter.

First, the first layer 6 is formed in the following way. The air pressure of the chamber 1 is reduced to $10^{-5}$ to $10^{-7}$ torr. The assisting ion gun 5 is driven and supplied with $N_2$ gas, thereby N+ ions as assisting ions are irradiated from the assisting ion gun 5 onto a surface of the Ni edge base 3. The current density generated by and the acceleration voltage for the N+ ions are set 0.38 mA/cm$^2$ and 700 eV, respectively. During the above operation, the Ni edge base holder 2 is rotated in the direction of the arrow of FIG. 1 at a speed of 10 to 20 rpm in order to uniformize the quality of the layer 6. The vapor deposition source 4 is driven to vapor-deposit Zr atoms toward the surface of the Ni edge base 3 simultaneously with the irradiation of the N+ ions. The vapor-depositing speed is set to be 650 Å/min.

The above operation is continued for 0.5 to 1 min., thereby to form the first layer 6 of ZrN having a thickness of 0.025 to 0.05 μm on the surface of the Ni edge base 3.

Then, the second layer 7 is formed in the following way. The irradiation of the N+ ions is stopped. $N_2$ gas is supplied from the assisting ion gun 5 to the chamber 1, and Zr atoms are vapor-deposited from the vapor deposition source 4 toward a surface of the first layer 6 in the $N_2$ atmosphere. The vapor-depositing speed is set to be 650 Å/min. During the above operation, the Ni edge base holder 2 is rotated in the direction of the arrow of FIG. 1 at 10 to 20 rpm in order to uniformize the quality of the layer 7.

The above operation is continued for 4 to 4.5 min., thereby to form the second layer 7 of ZrN having a thickness of 0.26 to 0.29 μm on the surface of the first layer 6.

As a result, a ZrN film consisting of two layers with a total thickness of approx. 0.3 μm is formed.

The first layer 6, which is a mixture layer of Ni and Zr, is adhered on the edge base 3 strongly.

Generally, the rise in temperature is 7° C./min. when assisting ions are employed and 2° C./min. when only a gas atmosphere is employed.

Experiment I

Figure 3:
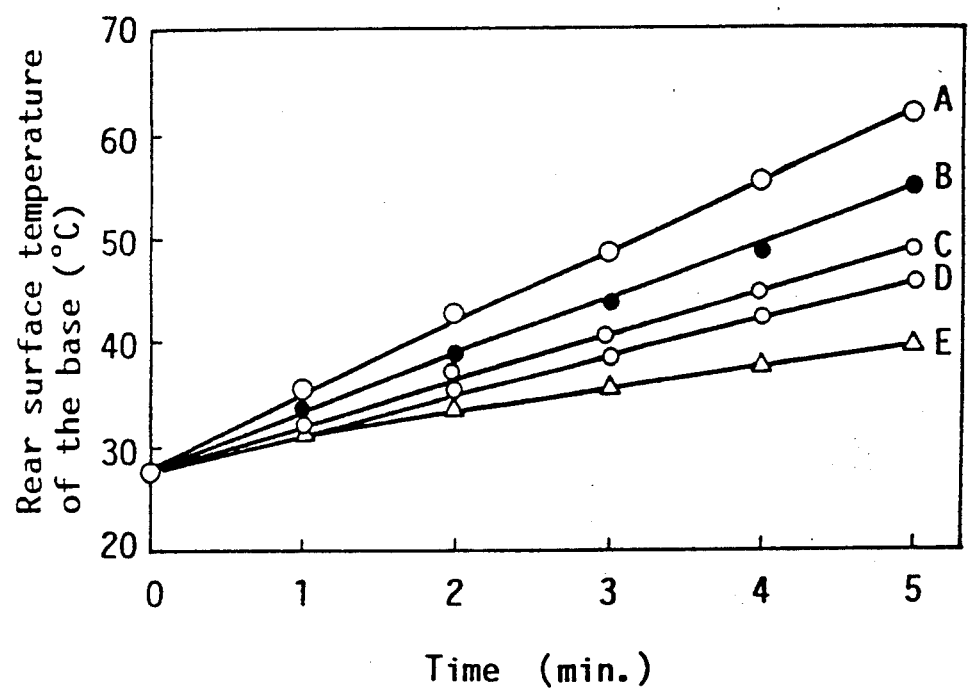
FIG. 3 is a graph showing the relationship between the temperature of a rear surface of a base body and the length of time of irradiating assisting ions.

ZrN films were formed on glass bases by using the method of this embodiment and other methods of irradiating only the assisting ions with certain acceleration voltages. The temperature of a rear surface of the base was measured in each case, the rear surface being opposed to the edge base holder 2. The results are shown in FIG. 3. The acceleration voltage was as follows:

A: 900 eV; B: 700 eV; C: 500 eV; D: 250 eV

E: by the method of this embodiment (irradiating the assisting ions with 700 eV for the first 0.5 to 1 minute and then supplying the gas)

As apparent from FIG. 3, the temperature rise was 20° C. max. larger within 5 minutes when the assisting ions were continuously used than when the method of this embodiment was used. According to this embodiment, film formation can be done with the surface temperature of the Ni edge base 3 being kept relatively low.

Experiment II

Figure 4A:
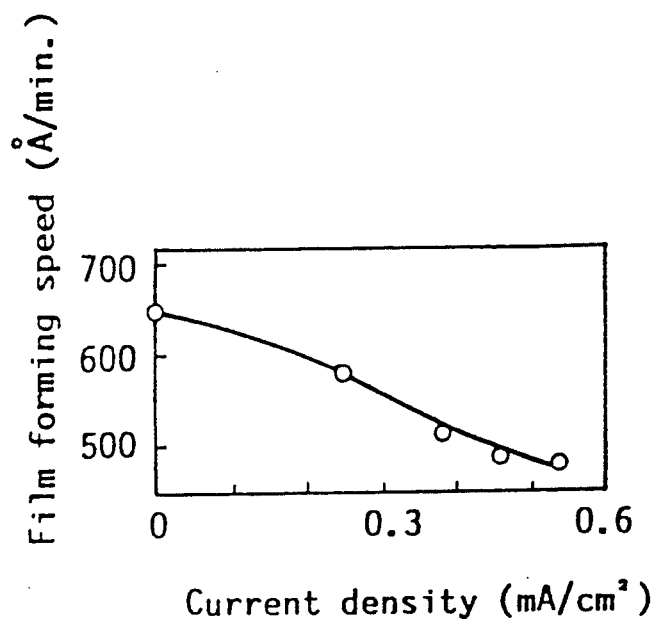
FIG. 4a is a graph showing the relationship between the film forming speed and the current density generated by the assisting ions.
Figure 4B:
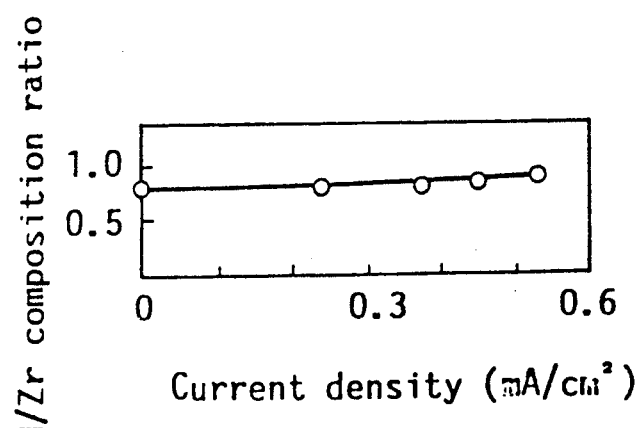
FIG. 4b is a graph showing the relationship between the N/Zr composition ratio and the current density generated by the assisting ions.

The relationship between the film forming speed and the current density generated by the assisting ions ($N^+$ in this case) was measured, the results of which are shown in FIG. 4a. The relationship between the N/Zr composition ratio and the current density generated the assisting ions was measured, the results of which are shown in FIG. 4b. The acceleration voltage for the $N^+$ ions was 700 eV, and the vapor-depositing speed of the Zr atoms was 650 Å/min.

The lower the current density is, the higher the film forming speed is. The film forming speed is highest when only the gas atmosphere is used (namely, when the current density is zero). The N/Zr composition ratio is not influenced by the current density.

Adjustment of the N/Zr arrival ratio

Figure 5:
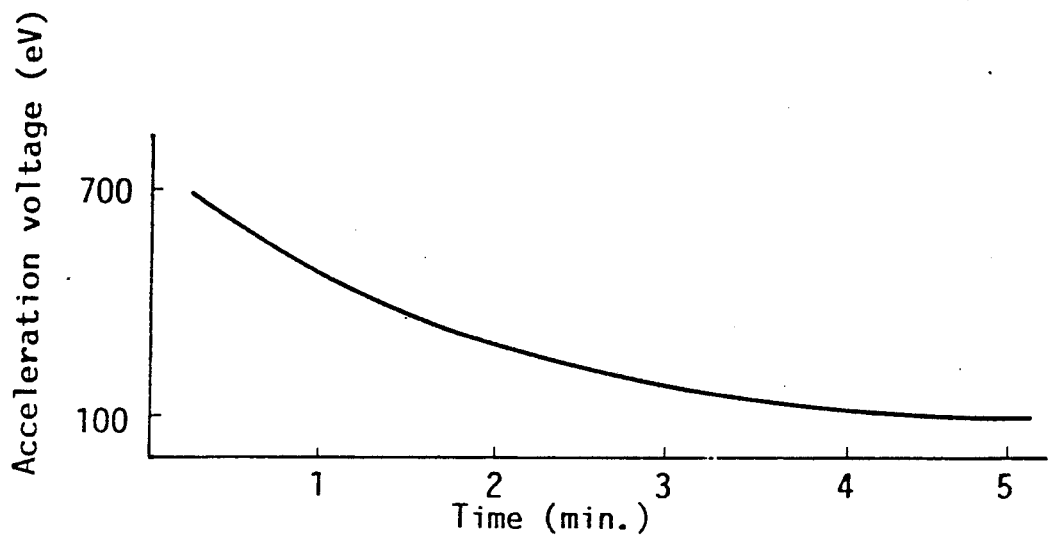
FIG. 5 is a graph showing an example of reducing the acceleration voltage for the N+ ions along the passage of time.

Although the acceleration voltage for the assisting ions is kept at a certain level in forming the first layer in this embodiment, the acceleration voltage can be variable. FIG. 5 shows an example, wherein the acceleration voltage for the $N^+$ ions is gradually reduced from 700 eV down to 100 eV in a slow, hyperbolic curve. In this way, the arrival amount ratio of the $N^+$ ions against the Zr atoms (will be referred to as the N/Zr arrival ratio, hereinafter) can be adjusted while the surface temperature of the Ni edge base 3 is kept at 100° C. or less.

Experiments concerning the first layer 6

Experiment III

Figure 6:
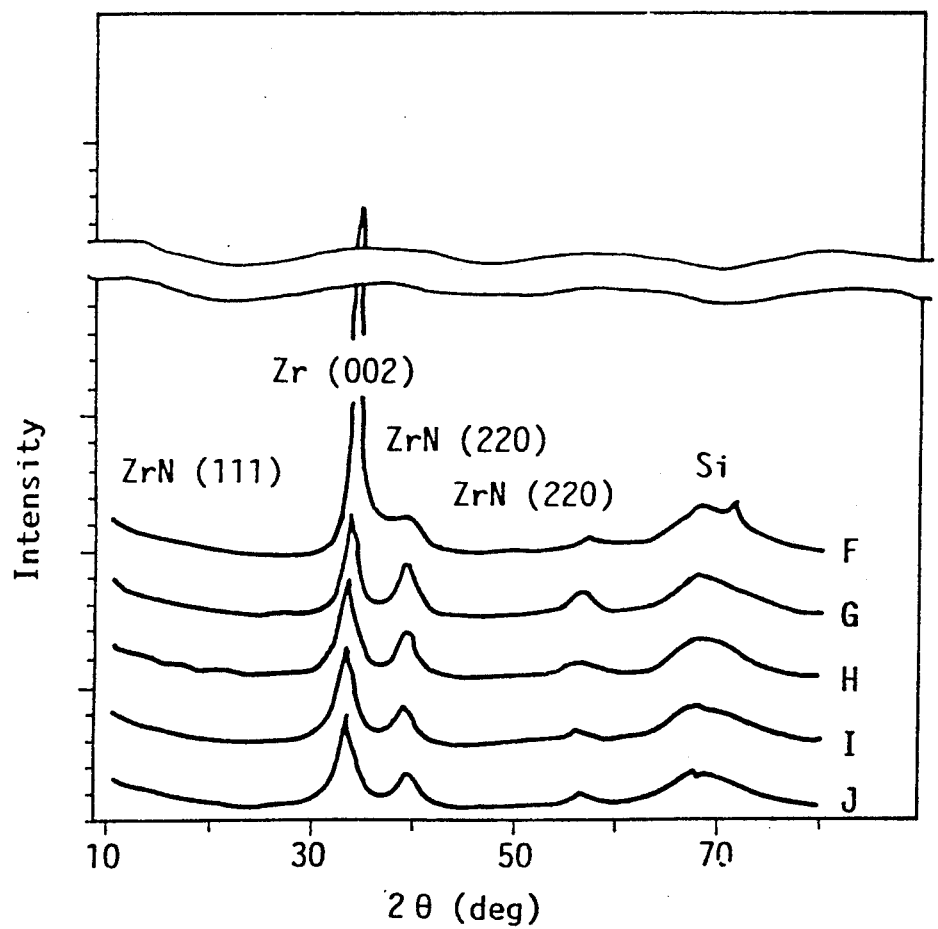
FIG. 6 is a graph showing X-ray diffraction results of first layers which are obtained by changing the forming conditions thereof.

An X-ray diffraction was carried out to obtain the relationship between the crystallinity of the first layer 6 and forming conditions of the first layer 6. The results are shown in FIG. 6. The N/Zr arrival ratio, the vapor-depositing speed of the Zr atoms and the current density generated by the $N^+$ ions were as follows:

TABLE 1

| Curve | N/Zr arrival ratio | Vapor-depositing Speed (Å/min.) | Current density (mA/cm$^2$) |
| --- | --- | --- | --- |
| F | 0.2 | 650 | 0.15 |
| G | 0.33 | 650 | 0.25 |
| H | 0.71 | 650 | 0.54 |
| I | 0.97 | 480 | 0.54 |
| J | 2.1 | 220 | 0.54 |

FIG. 6 shows an excellent crystallinity is obtained when the N/Zr arrival ratio is 0.2 or more.

Experiment IV

Figure 7:
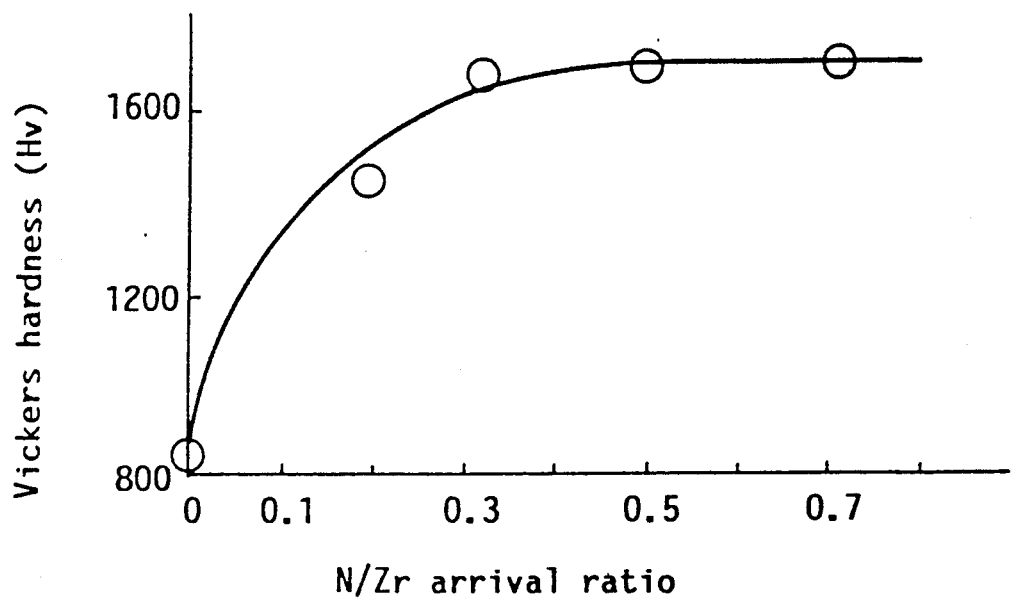
FIG. 7 is a graph showing the relationship between the hardness of the first layer and the N/Zr arrival ratio.

The relationship between the N/Zr arrival ratio and the Vickers hardness was measured. The results are shown in FIG. 7. The load and the acceleration voltage were 3 g and 200 eV, respectively. As apparent from FIG. 7, a high hardness is obtained when the N/Zr ratio is 0.2 or more.

Experiment V

Figure 8:
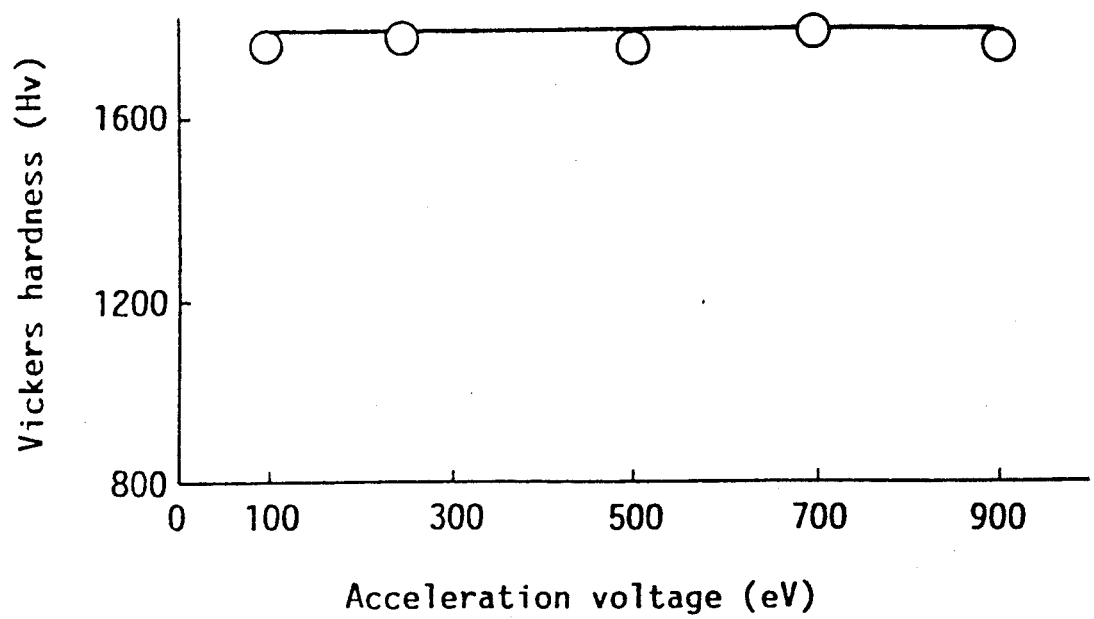
FIG. 8 is a graph showing the relationship between the hardness of the first layer and the acceleration voltage for the assisting ions.

The Vickers hardness was again measured by varying the acceleration voltage for the $N^+$ ions while fixing the N/Zr arrival ratio, the results of which are shown in FIG. 8. Regardless of the acceleration voltage, the Vickers hardness was maintained as high as 1,700 Hv.

Experiments concerning the second layer 7 and the ZrN film

Hereinafter, how the crystallinity of the second layer 7 is influenced by the forming conditions of the first layer 6 will be described.

Experiment IV

Figure 9:
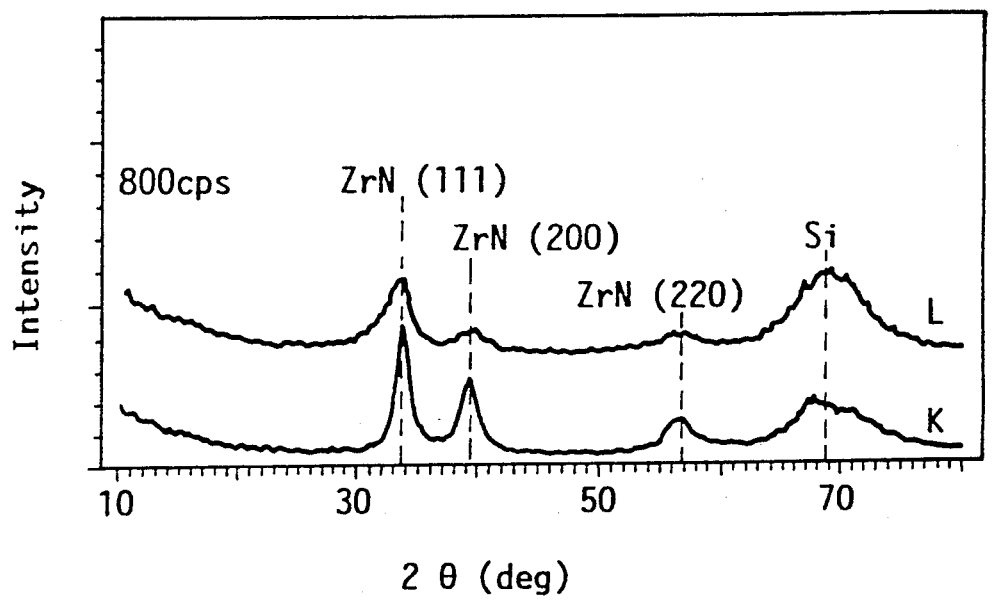
FIG. 9 is a graph showing X-ray diffraction results of the first layers which are formed with different N/Zr arrival ratios.

FIG. 9 shows X-ray diffraction results of the first layers formed with different N/Zr arrival ratios. K was obtained when the N/Zr arrival ratio was 0.33 and L when the N/Zr arrival ratio was 2.1. The peaks of ZrN (111), ZrN(200) and ZrN(220) of K and L are all approximately $2\theta$, but the peaks of K are sharper than those of L. In other words, the N/Zr arrival ratio is desirably small in order to obtain excellent crystallinity.

Experiment VII

Figure 10:
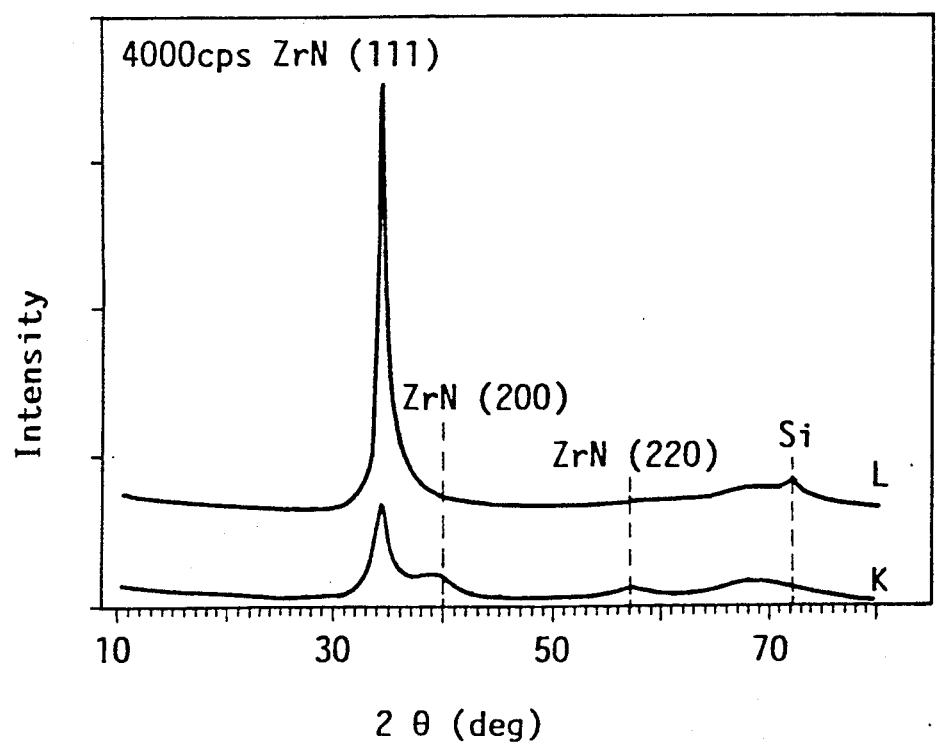
FIG. 10 is a graph showing X-ray diffraction results of ZrN films including the first layers formed with different N/Zr arrival ratios.

FIG. 10 shows X-ray diffraction results of the ZrN films including the above first layers. K was obtained when the N/Zr arrival ratio was 0.33 and L when the N/Zr arrival ratio was 2.1. The forming conditions of the second layers were the same for K and L. The ZrN (111) peak of L is sharper than that of K, which means that the worse the crystallinity of the first layer is, the better the total crystallinity is.

In this way, the crystallinity of the ZrN film can be controlled by adjusting the forming conditions of the first layer 6 while fixing the conditions of forming the second layer 7.

Experiment VIII

Figure 11:
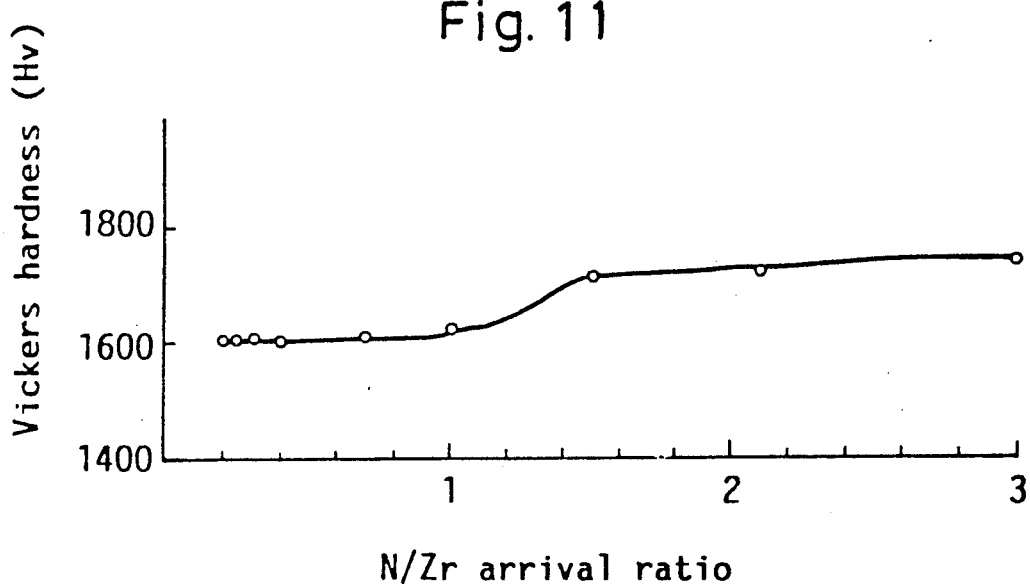
FIG. 11 is a graph showing the hardness of the ZrN films including the first layers formed with different N/Zr arrival ratios.

FIG. 11 shows the Vickers hardness of the ZrN films including the first layers formed with different N/Zr arrival ratios. A ZrN film hard enough for an electric razor can be obtained with the N/Zr arrival ratio of 0.2 or more. Higher hardness can be realized by enhancing the N/Zr arrival ratio to 1 or more in forming the first layer 6.

Summary

In this embodiment, the assisting ions are used for as short a period as possible to keep the temperature rise small while improving the adhering strength between the film and the Ni edge base 3; and then the gas atmosphere is used for a longer period to improve the film forming speed and crystallinity.

Figure 12:
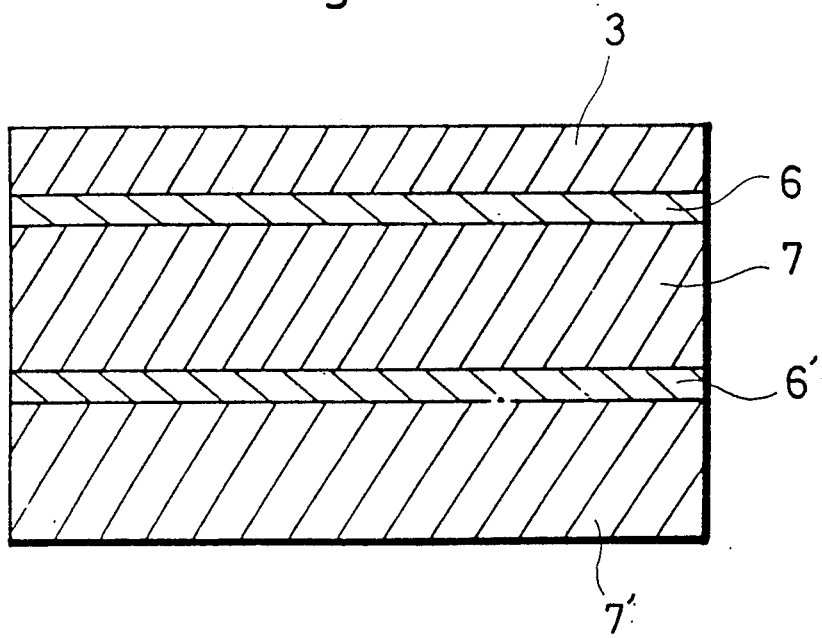
FIG. 12 is a cross sectional view of a ZrN film which is formed by repeating the method of the above embodiment.

Although the first and the second layers are formed only once in the first embodiment, a thick film (0.6 μm thick or more) as shown in FIG. 12 can also be formed by repeating the above operation in the above order. Since the edge base 3, the first layers 6 and 6', and the second layers 7 and 7 are all adhered strongly, peeling off or cracks can be prevented.

Embodiment II

A second embodiment of this invention will be described hereinafter. The same apparatus is used.

First, the first and the second layers 6 and 7 are formed on the edge base 3 in the same way as in the first embodiment. (The first and the second layers 6 and 7 will be referred to as the ZrN layer collectively, hereinafter.)

Then, carbon atoms are vapor-deposited toward the ZrN layer from the vapor deposition source 4, whereby to form a pseudo-diamond film on a surface of the ZrN layer. Hydrogen ions are simultaneously irradiated from the assisting ion gun 5 in order to prevent the film from graphitizing. The edge base holder 2 is rotated in the same way as the first embodiment in order to uniformize the quality of the pseudo-diamond film.

The conditions of forming the pseudo-diamond film are as follows:

| | |
|---|---|
| Vapor-depositing speed of carbon atoms: | 300 Å/min. |
| Acceleration voltage for hydrogen ions: | 200 to 500 eV |
| Current density by hydrogen ions: | 0.2 mA/cm$^2$ |
| Film forming speed: | 250 Å/min. |
| Film thickness: | 0.1 μm |

The Vickers hardness of an edge obtained by this embodiment was as high as 5,000 to 9,000 Hv.

Figure 13:
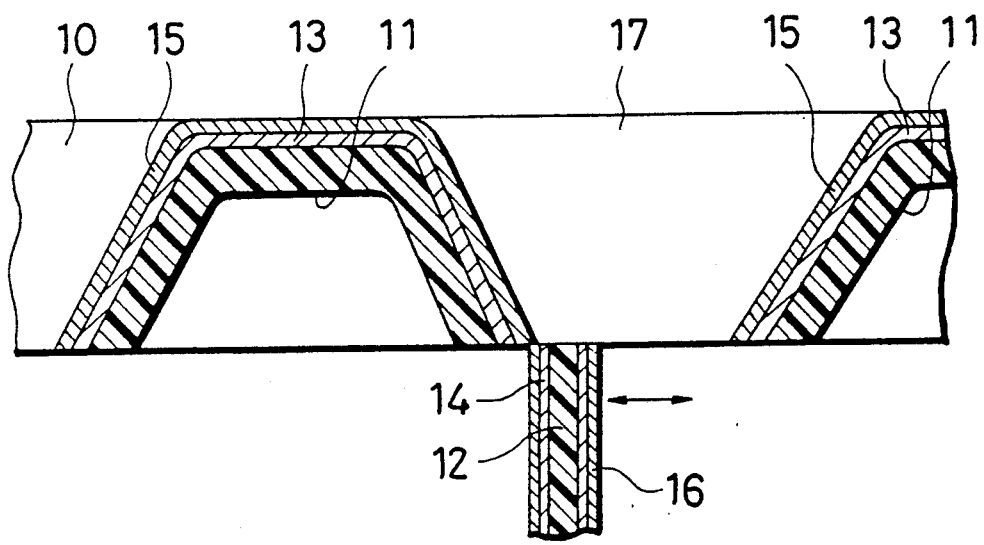
FIG. 13 is a cross sectional view of an edge of an electric razor formed by a second embodiment.

FIG. 13 shows an edge of an electric razor formed by the method of this embodiment. It comprises an external edge base 11 formed of Ni and an internal edge base 12 formed of stainless steel. 13 and 14 refers to ZrN layers, 15 and 16 to pseudo-diamond films, and 17 to a hole into which beard or moustache is to be inserted.

The pseudo-diamond film 15 or 16 can be adhered on the external or internal edge base 11 or 12 more strongly if the film is formed in three steps.

Step 1

The assisting ion gun 5 is driven and supplied with CH$_4$ (methane), thereby carbon ions are irradiated onto the surface of the ZrN layer.

Step 2

Hydrogen ions are irradiated from the assisting ion gun 5, and carbon atoms are vapor-deposited from the vapor deposition source 4, whereby to form pseudo-diamond cores on the surface of the ZrN layer. The acceleration voltage for and the current density generated by the hydrogen ions are 1,000 eV and 10 mA/cm$^2$, respectively.

Step 3

The operation of Step 2 is continued to form a pseudo-diamond film on the pseudo-diamond cores. The acceleration voltage for and the current density generated by the hydrogen ions are reduced to, for example, 200 eV and 2mA/cm$^2$, respectively.

The amount of and the acceleration voltage for the carbon ions are determined so that they should be optimum for forming pseudo-diamond cores on the ZrN layer easily and for adhering the pseudo-diamond film on the bases 11 and 12 strongly enough.

Figure 14:
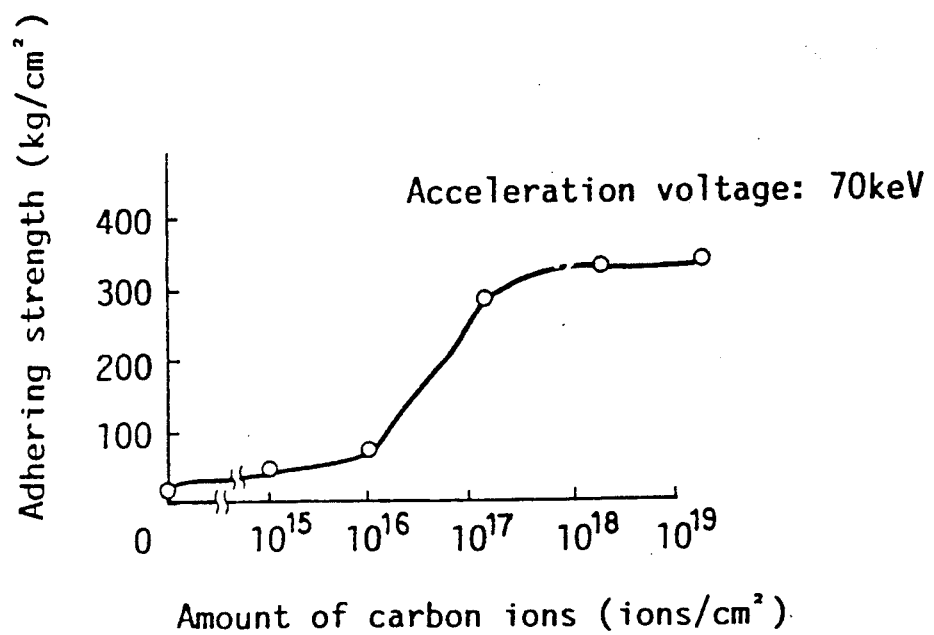
FIG. 14 is a graph showing the relationship, obtained from an experiment, between the amount of the carbon ions and the adhering strength of the pseudo-diamond film on a base body.

FIG. 14 shows the relationship, obtained from an experiment, between the amount of the carbon ions and the adhering strength of the pseudo-diamond film on a edge base 3. The edge base 3 was formed of stainless steel and the acceleration voltage was 70 keV. The amount of the carbon ions was measured based on the density of the current supplied from the assisting ion gun 5, and the adhering strength was measured by peeling the film off the edge base 3 by use of a peeling-off device. It is concluded from the result that the optimum amount of the carbon ions is $10^{17}$ to $10^{19}$ (ions/cm$^2$).

Figure 15:
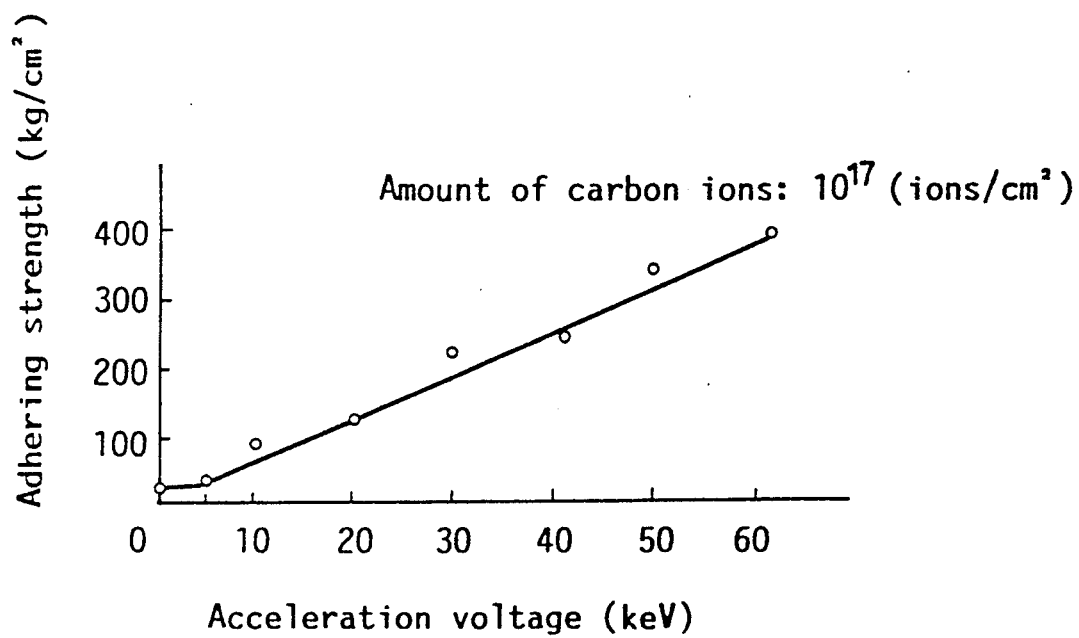
FIG. 15 is a graph showing the relationship, also obtained from an experiment, between the acceleration voltage for assisting ions and the above adhering strength.

FIG. 15 shows the relationship, also obtained from an experiment, between the acceleration voltage and the adhering strength. The amount of the carbon ions was $10^{17}$ (ions/cm$^2$). As apparent from this graph, the higher the acceleration voltage is, the larger the adhering strength is. However, if the acceleration voltage is too high, the carbon ions go deep inside the edge base 3 without roughening the surface of the edge base 3. Since easy formation of the pseudo-diamond cores requires the surface of the ZrN layer to be rough, the acceleration voltage should be low enough for the carbon ions to roughen the surface of the ZrN layer. Considering these facts, the optimum acceleration voltage is 1 to 100 keV when stainless steel is used for the edge base 3. If the edge base 3 is formed of a different material, the optimum amount of and acceleration voltage for the carbon ions are as shown below.

TABLE 2

| Edge base | Amount of carbon ions (ions/cm$^2$) | Acceleration voltage (keV) |
|---|---|---|
| Electrocasted nickel | $10^{17}$ to $10^{19}$ | 1 to 30 |
| Copper | $10^{17}$ to $10^{19}$ | 1 to 60 |

In the above embodiments, N$_2$ gas was supplied to the assisting ion gun 5 and Zr was used for increasing the hardness of the edge base 3. Needless to say, other materials can be used. To the assisting ion gun 5, the substances which are in the state of gas at the room temperature can be supplied. The followings are examples: H$_2$, O$_2$, CO, CH$_4$, CO$_2$, C$_2$H$_2$, NH$_3$ For increasing the hardness of the edge base 3, the followings can be used.
1) Minerals such as La, Ti, Nb, Ta, Mo, W, Co, Fe, Ni, Cr, Hf, V, Al, Mn, Re, Os, Cd, Au, Pt and Si
2) Oxides such as Al$_2$O$_3$, TiO$_2$, TA$_2$O$_3$, SiO$_2$, ZrO$_2$ and HfO$_2$
3) Nitrides such as AlN, BN, TiN, ZrN, HfN, CrN, CoN, WN, LaN, NbN, TaN and MoN
4) Carbonides such as TiC, SiC, WC, ZrC, BC, MoC and HfC; and borides such as TiB and WB
5) Non metals such as B and C Although the present invention has been fully described by way of an embodiment with references to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A method of improving the quality of an edge surface of a cutting device, the method comprising:
    a first step of irradiating first ions obtained from a first substance, the first substance being a gas at room temperature, and a second substance, which is vapor-deposited from a hard material, onto a surface of a base body to form a first hard layer comprising molecules of the hard material influenced by the first ions; and a second step of irradiating the second substance onto the first hard layer in an atmosphere of the first substance to form a second layer.

2. A method of claim 1, wherein the first substance is selected from a group consisting of $H_2$, $O_2$, $N_2$, CO, $CH_4$, $CO_2$, $C_2H_2$ and $NH_3$.

3. A method of claim 1, wherein the hard material is selected from a group consisting of La, Ti, Zr, Nb, Ta, Mo, W, Co, Fe, Ni, Cr, Hf, V, Al, Mn, Re, Os, Cd, Au, Pt, Si, $Al_2O_3$, $TiO_2$, $TA_2O_3$, $SiO_2$, $ZrO_2$, $HfO_2$, AlN, BN, TiN, ZrN, HfN, CrN, CoN, WN, LaN, NbN, TaN, MoN, TiC, SiC, WC, ZrC, BC, MoC, HfC, TiB, WB, B and C.

4. A method of claim 1, wherein the first layer is formed with a ratio of the first ions of the first substance against the second substance being 0.2 at the lowest, the ratio being measured on the base body.

5. A method of claim 4, wherein the above ratio is adjusted to control the orientation and the crystallinity of the second layer.

6. A method of claim 4, wherein an acceleration voltage for the first ions is reduced in the passage of time hyperbolically.

7. A method of claim 4, wherein the cutting device is an electric razor blade.

8. A method of claim 1, wherein the first step is finished before a temperature of the base body gets high enough to damage flexibility of the base body, and the second step is continued until the first and the second layers get a desirable total thickness.

9. A method of claim 1, wherein the first and the second steps are repeated in the above order.

10. A method of claim 1, further comprising a step of irradiating carbon atoms and hydrogen ions simultaneously to form a pseudo-diamond film on a surface of the second layer.

* * * * *